US008253214B2

United States Patent
Guidash et al.

(10) Patent No.: US 8,253,214 B2
(45) Date of Patent: Aug. 28, 2012

(54) CMOS SHARED AMPLIFIER PIXELS WITH OUTPUT SIGNAL WIRE BELOW FLOATING DIFFUSION INTERCONNECT FOR REDUCED FLOATING DIFFUSION CAPACITANCE

(75) Inventors: Robert M. Guidash, Rochester, NY (US); Ravi Mruthyunjaya, Penfield, NY (US); Weize Xu, Rochester, NY (US)

(73) Assignee: Omnivision Technologies, Inc., Santa Clara, CA (US)

( * ) Notice: Subject to any disclaimer, the term of this patent is extended or adjusted under 35 U.S.C. 154(b) by 1240 days.

(21) Appl. No.: 11/440,894

(22) Filed: May 25, 2006

(65) Prior Publication Data

US 2006/0273353 A1 Dec. 7, 2006

Related U.S. Application Data

(60) Provisional application No. 60/686,715, filed on Jun. 2, 2005.

(51) Int. Cl.
*H01L 31/02* (2006.01)
(52) U.S. Cl. .... 257/459; 257/758; 257/773; 257/E31.11
(58) Field of Classification Search .......... 257/431, 257/443, 446, 457, 459, 448, 758, 773, 774, 257/775, 776, E31.111, E31.112, E31.113, 257/E31.114, E31.124, E31.125
See application file for complete search history.

(56) References Cited

U.S. PATENT DOCUMENTS

| | | | |
|---|---|---|---|
| 6,657,665 B1 * | 12/2003 | Guidash | 348/308 |
| 6,750,912 B1 | 6/2004 | Tennant et al. | |
| 7,005,689 B2 * | 2/2006 | Song et al. | 257/290 |
| 7,115,925 B2 * | 10/2006 | Rhodes | 257/292 |
| 7,557,847 B2 * | 7/2009 | Okita et al. | 348/308 |
| 8,130,304 B2 * | 3/2012 | Yin et al. | 348/308 |
| 2003/0234432 A1 | 12/2003 | Song et al. | |
| 2004/0140491 A1 | 7/2004 | Rhodes et al. | |
| 2005/0012836 A1 | 1/2005 | Guidash | |

FOREIGN PATENT DOCUMENTS

| | | |
|---|---|---|
| EP | 0898312 | 2/1999 |
| EP | 1 017 106 A2 | 7/2000 |
| EP | 1 394 858 | 3/2004 |
| EP | 1 592 066 A2 | 11/2005 |
| FR | 2844398 | 3/2004 |
| JP | 11274461 | 10/1999 |

(Continued)

OTHER PUBLICATIONS

European Search Report for Application No. 10189352.7 dated Mar. 1, 2012, 5 pages.

(Continued)

*Primary Examiner* — Lynne Gurley
*Assistant Examiner* — Andrew O. Arena
(74) *Attorney, Agent, or Firm* — Blakely, Sokoloff, Taylor & Zafman

(57) ABSTRACT

An image sensor includes a unit cell having a plurality of pixels; the unit cell comprising an amplifier input transistor that is shared by the plurality of pixels; a plurality of floating diffusions that are joined by a floating diffusion interconnect layer and are connected to the amplifier input transistor; and an interconnect layer which forms an output signal wire which shields the floating diffusion interconnect layer.

6 Claims, 5 Drawing Sheets

FOREIGN PATENT DOCUMENTS

| | | |
|---|---|---|
| JP | 2001-298177 | 10/2001 |
| JP | 2002325204 | 11/2002 |
| JP | 2004023107 | 1/2004 |

OTHER PUBLICATIONS

International Preliminary Report on Patentability for Application No. PCT/US06/20716 dated Dec. 6, 2007, 8 pages.

Written Opinion for PCT Application No. PCT/US06/20716 dated Dec. 2, 2007, 7 pages.

International Search Report for Application No. PCT/US06/20716 dated Nov. 7, 2006, 7 pages.

Office Action for Application No. 200680019262.6 dated Dec. 12, 2008, 7 pages.

Office Action for Application No. 200680019262.6 dated Jul. 31, 2009, 5 pages.

Office Action for Application No. 200910178007.1 dated Jan. 25, 2011, 12 pages.

Office Action for Application No. 200910178007.1 dated Dec. 6, 2011, 13 pages.

Office Action for Application No. 06771466.7 dated Mar. 28, 2012, 3 pages.

Office Action for Application No. 06771466.7 dated Jun. 18, 2010, 5 pages.

Office Action for Application No. 2008-514748 (Japanese text, English translation not yet available) dated Mar. 27, 2012, 2 pages.

\* cited by examiner

CMOS SHARED AMPLIFIER PIXELS WITH OUTPUT SIGNAL WIRE BELOW FLOATING DIFFUSION INTERCONNECT FOR REDUCED FLOATING DIFFUSION CAPACITANCE

CROSS-REFERENCE TO RELATED APPLICATIONS

Reference is made to and priority claimed from U.S. Provisional Application Ser. No. 60/686,715, filed Jun. 2, 2005, entitled CMOS ACTIVE PIXEL SENSOR SHARED AMPLIFIER PIXEL WITH REDUCED SENSE NODE CAPACITANCE.

FIELD OF THE INVENTION

The invention relates generally to the field of CMOS image sensors and, more particularly, to such image sensors where multiple photodetectors share an amplifier.

BACKGROUND OF THE INVENTION

In FIG. 1, the 2 shared pixel schematic of a prior art image sensor includes two photodetectors (PD1 and PD2) each having an associated transfer gate (TG1 and TG2) that transfer charge to a common floating diffusion sense node. A row select transistor (RSEL) selects the row for readout, and a reset transistor with a reset gate (RG) resets the common floating diffusion sense node (n+) to a predetermined voltage. A source follower input transistor (SF) senses the voltage on the common floating diffusion sense node (n+) and amplifies the signal. The prior art image sensor in FIG. 2 is a similar concept except that four photodiodes (PD1-PD4) and TGs (TG1-TG4) share common components.

These shared amplifier pixels were intended to produce small pixels with high fill factor with less scaled CMOS processes. With a small pixel, the photodiode can have low charge capacity. Shared amplifier pixels inherently have higher floating diffusion capacitance than un-shared amplifier pixels, due to having multiple floating diffusions connected together. The larger capacitance is a consequence of multiple floating diffusion regions comprising a single charge to voltage conversion node, and due to the parasitic capacitance of the interconnect layers connecting the multiple floating diffusion regions. As a result, it is desired to reduce the floating diffusion capacitance so that an adequate voltage signal swing can be achieved at the sense node.

Consequently, the present invention describes ways to reduce the floating diffusion capacitance in shared amplifier CMOS Active Pixel Sensor (APS) designs.

SUMMARY OF THE INVENTION

The present invention is directed to overcoming one or more of the problems set forth above. Briefly summarized, according to one aspect of the present invention, the present invention resides in an image sensor comprising a unit cell having a plurality of pixels; the unit cell comprising (a) an amplifier input transistor that is shared by the plurality of pixels; (b) a plurality of floating diffusions that are joined by a floating diffusion interconnect layer and are connected to the amplifier input transistor; and (c) an interconnect layer which forms an output signal wire which shields the floating diffusion interconnect layer.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the following advantage of reducing the charge to voltage conversion region also referred to as a sense node capacitance in shared amplifier CMOS Active Pixel Sensor (APS) designs.

BRIEF DESCRIPTION OF THE DRAWINGS

FIG. 3b is a side view in cross section along line 3b-3b of FIG. 3a;

DETAILED DESCRIPTION OF THE INVENTION

Before discussing the present invention in detail, it is instructive to note that the present invention is preferably used in, but not limited to, a CMOS active pixel sensor. Active pixel sensor refers to active electrical elements within the pixel such as the reset transistor and row select transistor, and CMOS refers to complementary metal oxide silicon type electrical components such as transistors which are associated with the pixel, but typically not in the pixel, and which are formed when the source/drain of a transistor is of one dopant type and the opposite dopant type encloses it. CMOS devices typically consume less power.

Figure 1:
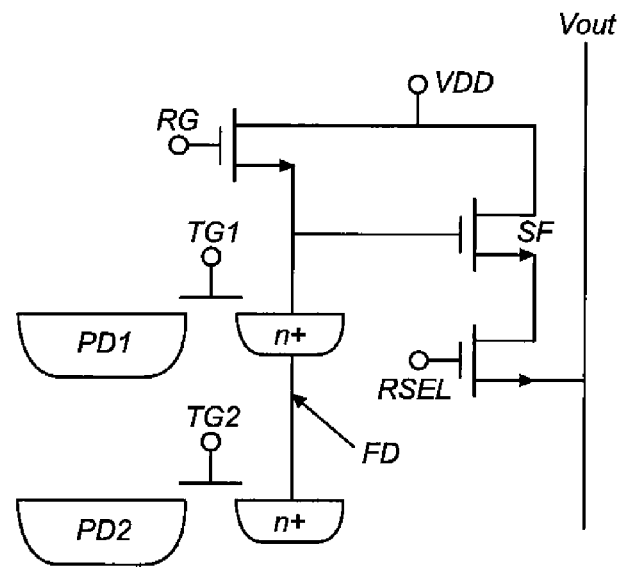
FIG. 1 is a schematic diagram of a prior art image sensor having two photodiodes sharing an amplifier.
Figure 2:
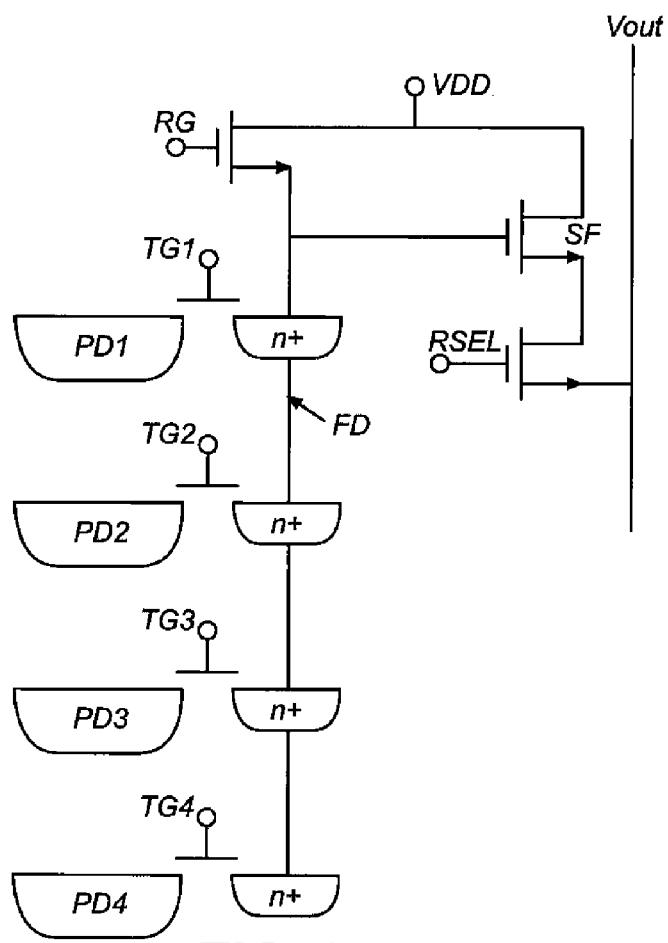
FIG. 2 is a schematic diagram of a prior art image sensor having four photodiodes sharing an amplifier.
Figure 3A:
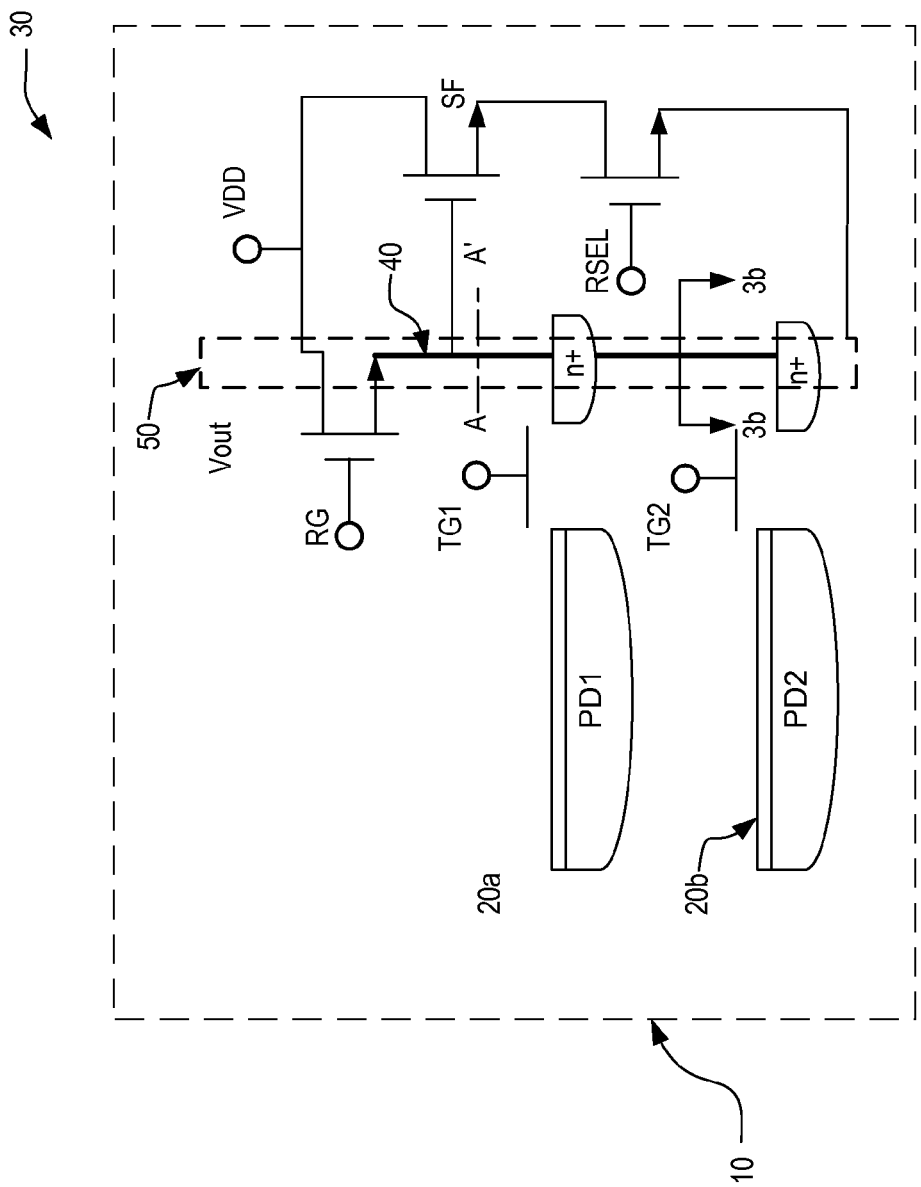
FIG. 3a is a schematic diagram of the image sensor of the present invention having two photodiodes sharing a common sense node which uses the output bus to shield the floating diffusion interconnect layer.

Referring to FIG. 3a, there is shown a schematic diagram of a unit cell 10 having a plurality of pixels 20a and 20b. The image sensor 30 of the present invention includes a plurality of unit cells 10 that form the pixel array. Each unit cell 10 includes two or more photosensitive regions (PD1 and PD2) that accumulate charge in response to incident light. Preferably, photodiodes are used as the photosensitive region (PD1 and PD2) and preferably two pixels form a unit cell 10. A row select transistor RSEL selects the row for output. Each photosensitive region (PD1 and PD2) respectively includes a transfer gate (TG1 and TG2) for transferring the charge to their respective shared sense node (n+), preferably a floating diffusion, which converts the charge to a voltage. The sense nodes (n+) are electrically connected together by a floating diffusion interconnect layer 40. A reset gate (RG) resets the voltage on the sense node (n+) to a predetermined voltage prior to the transfer of charge from the photosensitive region (PD1 and PD2) to the sense node (n+). An amplifier, preferably a source follower (SF), senses the voltage on electrically connected sense nodes (n+) for output on an output bus or output wire 50.

Figure 3B:
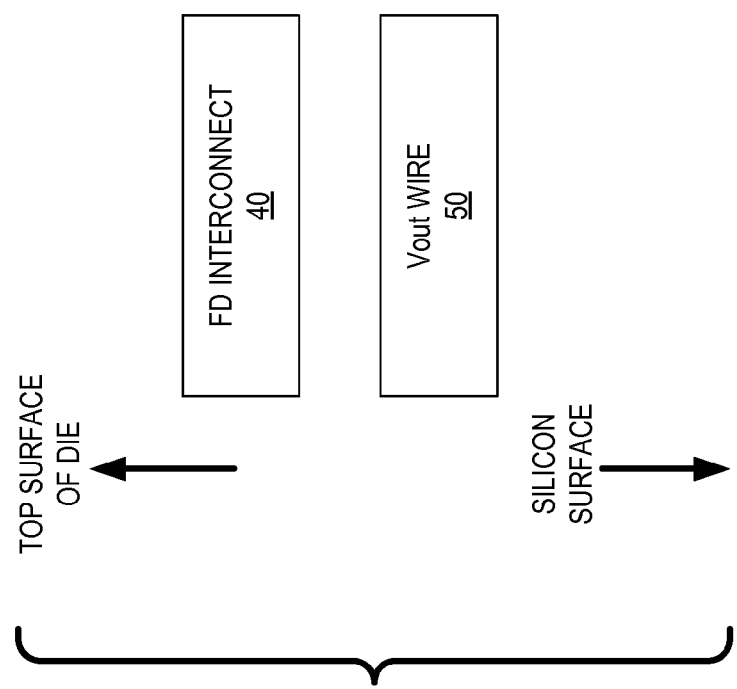

Referring to FIGS. 3a and 3b, it is instructive to note that the output wire 50 is physically placed so that it shields the floating diffusion interconnect layer 40. This reduces the capacitance of the electrically connected floating diffusions (n+). The floating diffusion interconnect layer 40 is routed in a metal interconnect layer that is preferably physically above or higher than that of the output wire 50. By shielding the floating diffusion interconnect layer or wire 40 with a routing of the output wire 50 below it, the parasitic capacitance of the floating diffusion interconnect layer 40 is reduced. Typically, the output wire 50 would be wider than the floating diffusion interconnect layer 40 to produce more effective shielding.

Although the preceding embodiments are shown having two photodiodes sharing an amplifier, the present invention is applicable to any number of photodiodes sharing an amplifier. For example, there may be 3 or more photodiodes sharing an amplifier.

Figure 4A:
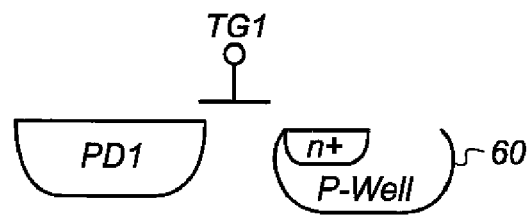
FIG. 4a is a schematic diagram of a prior art pixel having the floating diffusion in a P-Well.
Figure 4B:
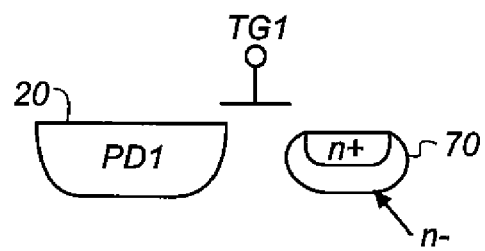
FIG. 4b is a schematic diagram of a pixel of the present invention having the floating diffusion in a deeper and more lightly doped n-type implant and with the NMOS P-Well implant masked from the floating diffusion region.
Figure 4C:
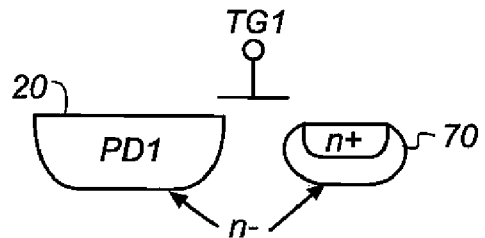
FIG. 4c is a schematic diagram of a pixel of the present invention and a more specific embodiment of FIG. 4b wherein the deeper and more lightly doped n-type implant is formed with an implant that is also used in the photodetector.

Referring to FIGS. 4b and 4c, an alternative method for reducing the floating diffusion capacitance for shared pixel designs is by use of a deeper and more lightly doped implant for the n+ active area regions of the floating diffusion, and removal or modification of the P-Well from the floating diffusion region. This reduces the junction capacitance of the floating diffusion sense node. Typically in the prior art (shown in FIG. 4a), the floating diffusion active area region (n+) is implanted with the n+ source/drain of the complementary metal oxide semiconductor (CMOS) process and is enclosed by the P-Well 60 used to form n-type metal oxide semiconductor field effect transistors (MOSFETs). This n+ source/drain implant is typically higher than 1e14 $cm^2$ and results in a junction depth of less than 0.20 um. The P-Well 60 is also a high dose implant yielding effective p-type background concentrations of greater than 1e16 cm-3. The present invention shown in FIGS. 4b and 4c uses an additional n-type implant 70 in the floating diffusion active area region (n+) to increase the depletion region width. This is done separately or in conjunction with elimination of the P-Well implant from all or part of the floating diffusion region, or modification of the P-Well implant to have a lower background concentration. The additional n-type implant 70 would typically be Phosphorous at an energy of greater than or equal to 50 KeV, and a dose of less than 1e14 $cm^2$. This implant is preferred to be the photodiode implant used to form the photodetector 20.

Figure 5:
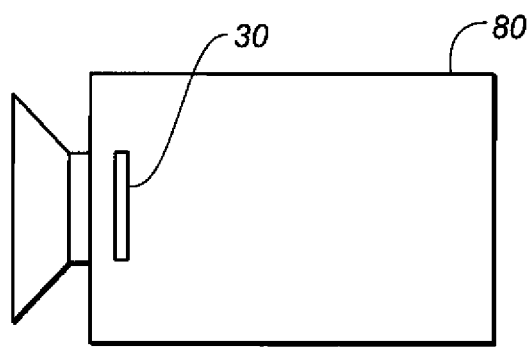
FIG. 5 is an illustration of a digital camera of the present invention.

Referring to FIG. 5, there is shown a digital camera 80 having the image sensor 30 disposed therein for illustrating a typical commercial embodiment to which the ordinary consumer is accustomed.

The invention has been described with reference to a preferred embodiment. However, it will be appreciated that variations and modifications can be effected by a person of ordinary skill in the art without departing from the scope of the invention.

PARTS LIST 10 unit cell
20 photodetector
20a pixel
20b pixel
30 image sensor
40 floating diffusion interconnect layer or wire
50 output bus or output wire
60 P-Well
70 n-type implant
80 digital camera

The invention claimed is:

1. An image sensor comprising:
a unit cell having a plurality of pixels; the unit cell comprising:
(a) an amplifier input transistor that is shared by the plurality of pixels;
(b) a plurality of floating diffusions that are joined by a floating diffusion interconnect layer and are connected to the amplifier input transistor; and
(c) a row select transistor electrically connected to an output signal wire,
wherein the floating diffusion interconnect layer is positioned directly over a portion of the output signal wire to shield the floating diffusion interconnect layer.

2. An image sensor comprising:
a unit cell having a plurality of pixels, each pixel comprising a photodetector comprising an n-type implant and a transfer gate; the unit cell comprising:
(a) an nMOS transistor comprising an n-type source drain implant disposed in a P well;
(b) a plurality of floating diffusions that are joined by a floating diffusion interconnect layer;
wherein the plurality of floating diffusions each have an n-type source drain implant and a deeper n-type implant that is more lightly doped than the floating diffusion n-type source drain implant with the deeper n-type implant enclosing the floating diffusion n-type source drain implant, wherein the floating diffusion n-type source drain implants and the deeper n-type implants are not disposed in the P well and the photodetector n-type implants and the deeper n-type implants are formed by the same implant; and
(c) a row select transistor electrically connected to an output signal wire,
wherein the floating diffusion interconnect layer is positioned directly a portion of the output signal wire to shield the floating diffusion interconnect layer.

3. An image sensor comprising:
a unit cell having a plurality of pixels, each pixel comprising a photodetector comprising an n-type implant and a transfer gate; the unit cell comprising:
(a) a plurality of floating diffusions having n-type source drain implants, and the floating diffusions are joined by a floating diffusion interconnect layer; wherein a deeper n-type implant that is more lightly doped than the n-type source drain implant encloses at least one of the n-type source drain implants for reducing junction capacitance, and wherein the photodetector n-type implants and the deeper n-type implants are formed by the same implant; and
(b) a row select transistor electrically connected to an output signal wire,
wherein the floating diffusion interconnect layer is positioned directly over a portion of the output signal wire to shield the floating diffusion interconnect layer.

4. A camera comprising:
an image sensor comprising:
a unit cell having a plurality of pixels; the unit cell comprising:
(a) an amplifier input transistor that is shared by the plurality of pixels;
(b) a plurality of floating diffusions that are joined by a floating diffusion interconnect layer and are connected to the amplifier input transistor; and
(c) a row select transistor electrically connected to an output signal wire, wherein the floating diffusion interconnect layer is positioned directly over a portion of the output signal wire to shield the floating diffusion interconnect layer.

5. A camera comprising:

an image sensor comprising:

a unit cell having a plurality of pixels, each pixel comprising a photodetector comprising an n-type implant and a transfer gate; the unit cell comprising:

(a) an nMOS transistor comprising an n-type source drain implant disposed in a P well;

(b) a plurality of floating diffusions that are joined by a floating diffusion interconnect layer;

wherein the plurality of floating diffusions each have an n-type source drain implant and a deeper n-type implant that is more lightly doped than the floating diffusion n-type source drain implant with the deeper n-type implant enclosing the floating diffusion n-type source drain implant, wherein the floating diffusion n-type source drain implants and the deeper n-type implants are not disposed in the P well and the photodetector n-type implants and the deeper n-type implants are formed by the same implant; and c) a row select transistor electrically connected to an output signal wire, wherein the floating diffusion interconnect layer is positioned directly a portion of the output signal wire to shield the floating diffusion interconnect layer.

6. A camera comprising:

an image sensor comprising:

a unit cell having a plurality of pixels, each pixel comprising a photodetector comprising an n-type implant and a transfer gate; the unit cell comprising:

(a) a plurality of floating diffusions having n-type source drain implants, and the floating diffusions are joined by a floating diffusion interconnect layer; wherein a deeper n-type implant that is more lightly doped than the n-type source drain implant encloses at least one of the n-type source drain implants for reducing junction capacitance, and wherein the photodetector n-type implants and the deeper n-type implants are formed by the same implant; and (b) a row select transistor electrically connected to an output signal wire, wherein the floating diffusion interconnect layer is positioned directly over a portion of the output signal wire to shield the floating diffusion interconnect layer.

* * * * *